United States Patent

Wendelrup et al.

[11] Patent Number: 5,943,613
[45] Date of Patent: Aug. 24, 1999

[54] METHOD AND APPARATUS FOR REDUCING STANDBY CURRENT IN COMMUNICATIONS EQUIPMENT

[75] Inventors: Heino Jean Wendelrup, Malmö; Björn Martin Gunnar Lindquist, Bjärred, both of Sweden

[73] Assignee: Telefonaktiebolaget LM Ericsson, Stockholm, Sweden

[21] Appl. No.: 08/747,010

[22] Filed: Nov. 7, 1996

[51] Int. Cl.[6] .................................................. H04B 1/16
[52] U.S. Cl. .......................... 455/343; 455/208; 455/259; 455/265; 331/18; 375/354
[58] Field of Search ................................. 455/343, 38.3, 455/75, 164.2, 208, 255, 257, 258, 259, 260, 265, 76; 331/2, 18, 25, 49; 340/825.44; 375/354, 374, 376

[56] References Cited

U.S. PATENT DOCUMENTS

| | | |
|---|---|---|
| 5,055,802 | 10/1991 | Hietala et al. ............................ 331/16 |
| 5,070,310 | 12/1991 | Hietala et al. ........................... 331/1 A |
| 5,187,471 | 2/1993 | Wagai et al. ........................ 340/825.44 |
| 5,331,293 | 7/1994 | Shepherd et al. ........................ 331/1 R |
| 5,416,435 | 5/1995 | Jokinen et al. .......................... 327/113 |
| 5,448,755 | 9/1995 | Tanaka .................................... 455/38.3 |
| 5,493,700 | 2/1996 | Hietala et al. ............................. 455/75 |
| 5,511,235 | 4/1996 | Duong et al. ............................. 455/75 |
| 5,548,250 | 8/1996 | Fang ......................................... 331/14 |
| 5,701,602 | 12/1997 | Shimoda ................................. 455/260 |

FOREIGN PATENT DOCUMENTS

| | | |
|---|---|---|
| 0 579 978 | 1/1994 | European Pat. Off. . |
| 0 726 508 | 8/1996 | European Pat. Off. . |
| 91/07824 | 5/1991 | WIPO . |
| 95/10141 | 4/1995 | WIPO . |

*Primary Examiner*—Wellington Chin
*Assistant Examiner*—Lee Nguyen
*Attorney, Agent, or Firm*—Burns, Doane, Swecker & Mathis, L.L.P.

[57] ABSTRACT

A method and apparatus for reducing power consumption in a communication device. In a standby mode, a relatively high power clock with a high degree of accuracy is powered down and a lower power, low frequency clock is used to maintain system synchronization. Synchronization means are provided to improve the accuracy of the low frequency clock during the standby mode.

10 Claims, 2 Drawing Sheets

METHOD AND APPARATUS FOR REDUCING STANDBY CURRENT IN COMMUNICATIONS EQUIPMENT

FIELD OF THE INVENTION

The present invention generally relates to communications systems. More particularly, the present invention relates to current reduction in mobile communications equipment during a standby mode of operation.

BACKGROUND OF THE INVENTION

To reduce power consumption in mobile communications equipment, it is frequently desirable to provide for a standby or idle mode of operation. During standby mode, the equipment is active only during short intervals when listening for a page, and is powered down during the remaining intervals. It is important to maintain accurate system timing to ensure that the equipment is active during precisely the correct intervals. It is also highly desirable to reduce the power consumption of the equipment as much as possible in the standby or idle mode.

To maintain system timing in a typical GSM communication device, a clock having a relatively high degree of accuracy (e.g., 1 ppm) is provided which is active at all times, including during standby. Such clocks can consume relatively large amounts of power. An exemplary clock used in mobile phones is a voltage controlled crystal oscillator (VCXO) which runs at, e.g., 13 MHz. In addition, a mobile phone may also have a simple low-power real time clock (RTC) for showing time on a communications device display. This clock runs at a much lower frequency (32.768 kHz) and is typically not very accurate (e.g., 10–20 ppm, depending upon the quality of the clock crystal).

It would therefore be desirable to reduce the power consumption of communications equipment operating in a standby mode by switching the high frequency, high current clock off, yet maintain accurate system timing.

U.S. Pat. No. 5,493,700 to Hietala et al. (Hietala '700) discloses an automatic frequency control (AFC) apparatus for a radiotelephone. The radiotelephone includes a transmitter, a receiver, a user interface, control logic, and a synthesizer which provides signals at an appropriate frequency to the transmitter and receiver, and which provides a clock signal to the user interface and control logic. The control logic controls the frequency of the synthesizer. The synthesizer includes two fractional-N synthesizers and a phase-locked loop. The Hietala '700 patent does not disclose a method for reducing current in a standby mode while maintaining accurate system timing.

U.S. Pat. No. 5,055,802 to Hietala et al. (Hietala '802) discloses a multiaccumulator sigma-delta fractional-N synthesizer which controls the frequency of a voltage controlled oscillator output signal. Relatively small frequency offset increments can be introduced into the synthesizer. The Hietala '802 patent does not disclose a method for reducing current in a standby mode while maintaining accurate system timing.

U.S. Pat. No. 5,070,310 to Hietala et al. (Hietala '310) discloses a multiple latched accumulator fractional N-synthesizer for a digital radio transceiver which avoids data "ripple" through multiple accumulators, and which reduces spurious signals. The Hietala '310 does not disclose a method for reducing current in a standby mode while maintaining accurate system timing.

U.S. Pat. No. 5,331,293 to Shepherd et al. (Shepherd) discloses a digital frequency synthesizer which compensates for spurious signals by demodulating, inverting, and amplifying the synthesizer output to generate a compensation signal which adjusts a reference oscillator. Shepherd does not address the reduction of power consumption by providing for a standby mode while maintaining accurate system timing.

It is known in Pacific Digital Cellular mobile phones to power down a high frequency crystal oscillator and use a second oscillator, which operates at a lower frequency and consumes less power, during an idle mode. In the PDC system, however, the symbol rate is 21 ks/s, which is significantly lower than the 270.833 ks/s in the GSM system. As a result, PDC system timing requirements are significantly less precise than the timing requirements of GSM and other systems, and there is no need for an accurate low frequency oscillator in a PDC system. Thus, the power reduction method in the PDC system is not suitable for GSM or other relatively high bit rate systems having relatively stringent timing requirements.

SUMMARY OF THE INVENTION

According to exemplary embodiments of the present invention, a circuit for reducing power consumption in a communications device includes a low power, low frequency real time clock (RTC) oscillator and synchronization means for synchronizing the RTC oscillator to a relatively higher power and higher frequency master clock. During a standby or idle mode, the high frequency master clock is powered down, and system timing is maintained by the lower frequency clock. According to various embodiments, the synchronization means can be implemented by an open loop real time correction circuit, a digital closed loop real time correction circuit, a phase-locked loop (PLL) correction circuit, a fractional-N PLL circuit, or other equivalent means.

The method and apparatus of the present invention allow a communications device to be operated in a low-power, standby mode of operation while still maintaining accurate system timing. The present invention is particularly useful in the GSM system or in other mobile communication system having relatively precise timing requirements.

BRIEF DESCRIPTION OF THE DRAWINGS

A more complete understanding of the present invention can be obtained upon reading the following Detailed Description of the Preferred Embodiments in conjunction with the accompanying drawings, in which like reference indicia indicate like elements, and in which.

DETAILED DESCRIPTION OF THE PREFERRED EMBODIMENTS

According to the present invention, a communication device which operates in a system having a relatively high data rate or having relatively strict timing requirements (e.g., a mobile telecommunications system according to the GSM standard) includes circuitry enabling the device to operate in two modes: a normal operation mode and a standby operation mode. In the standby operation mode, at least a portion of the elements of the device are powered up only for certain specified intervals. A standby clock, separate from a reference clock, is provided to maintain accurate timing and ensure that the appropriate elements are powered up during the correct intervals. The standby clock operates at a lower frequency than the reference clock, and draws less current than the reference clock. The present invention includes synchronization means for synchronizing the standby clock to the reference clock, such that a relatively high clock accuracy (e.g., 1 ppm) is achieved from a clock having a relatively low accuracy (e.g., 10–20 ppm).

Figure 1:
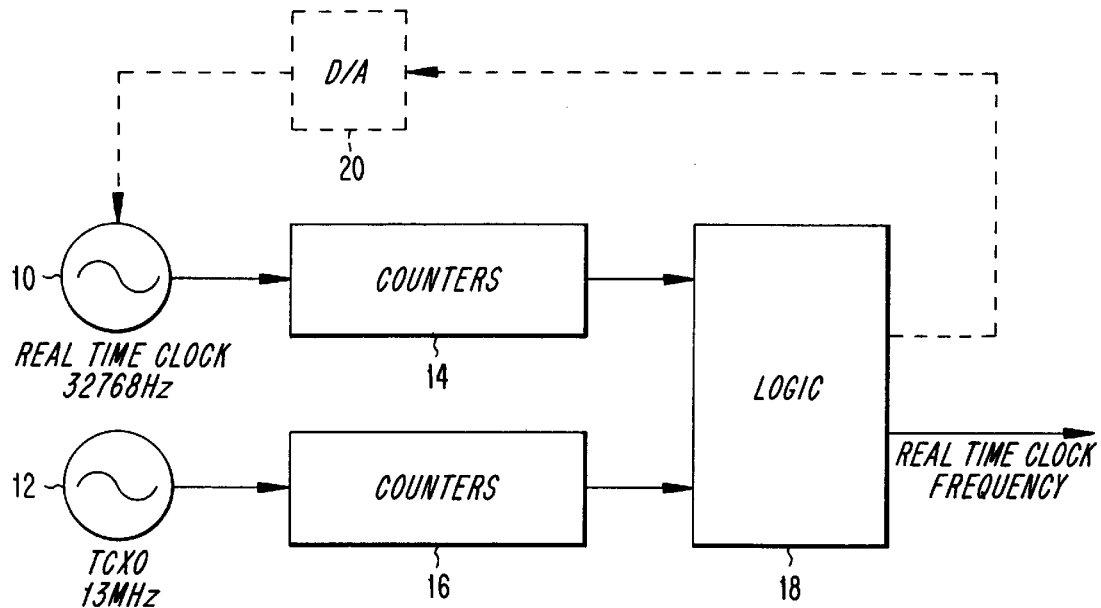
FIG. 1 is a block diagram of a power reduction circuit using open-loop and closed-loop digital timing correction circuits according to one embodiment of the present invention.

Referring now to FIG. 1, a first embodiment of the invention, in which an open loop timing correction circuit is used to synchronize standby (RTC) clock 10 with reference clock 12, is shown. According to this embodiment, the frequency of the RTC oscillator 10 is accurately measured and then the system timing is corrected or adjusted accordingly. By knowing the exact frequency of the RTC clock 10, it is possible to use the RTC signal as the system clock during idle standby time, thus maintaining system synchronization while the accurate VCXO 12 is switched off. As shown in FIG. 1, first and second counters 14 and 16 are connected to receive the outputs of RTC 10 and VCXO 12, respectively. Logic circuitry 18 receives the counter outputs and generates based on the counter outputs for a predetermined interval, a refined RTC signal. The predetermined interval is chosen based on the frequency of the VCXO 12, and is preferably long enough to achieve a desired level of accuracy.

Alternatively, the RTC frequency can be adjusted to synchronize the RTC to the reference clock 12. This adjustment can be performed by a digital closed loop frequency locking of the RTC 10 to the more accurate VCXO 12, as shown by the dashed line in FIG. 1.

The closed-loop circuit includes RTC 10, VCXO 12, counters 14 and 16, logic circuit 18, and means for controlling the frequency of RTC 10, which can be implemented by a D/A converter 20 connected in a feedback loop between an output of logic circuit 18 and an input to RTC clock 10.

The closed loop method requires a relatively long correction time to achieve a desirable level of accuracy. The compensation value is preferably updated frequently when the communication device is first turned on, due to self heating of the device at power-up. After a brief period of sustained operation, the compensation value update can be performed less frequently.

The closed loop method advantageously achieves a very accurate RTC clock (ideally the same accuracy as the VCXO). Relatively low cost crystals (e.g., having accuracy of 20 ppm at 32.768 kHz) can be used for the oscillators. The operational temperature characteristics of the RTC crystal need only be within the tuning range of the RTC frequency control.

An alternative embodiment, which reduces the RTC frequency correction time, includes the use of a phase locked loop (PLL). While using a PLL is well known in mobile phones to lock relatively high frequency (1 GHz) oscillators to an accurate lower frequency (13 MHz) VCXO, the present invention uses a PLL to lock a relatively low frequency oscillator 10 to an accurate higher frequency VCXO 12. It will be appreciated that the lock-in time in a PLL is a function of the loop filter cut-off frequency (assuming that the comparison frequency is high enough), as discussed below. Although a higher cut-off frequency introduces more noise, the increased noise does not significantly affect the RTC 10 in this implementation.

The PLL locks the RTC 10, to the accurate VCXO 12 when the VCXO is powered up, and maintains this value in the RTC 10 when the VCXO 12 is powered down.

Figure 2:
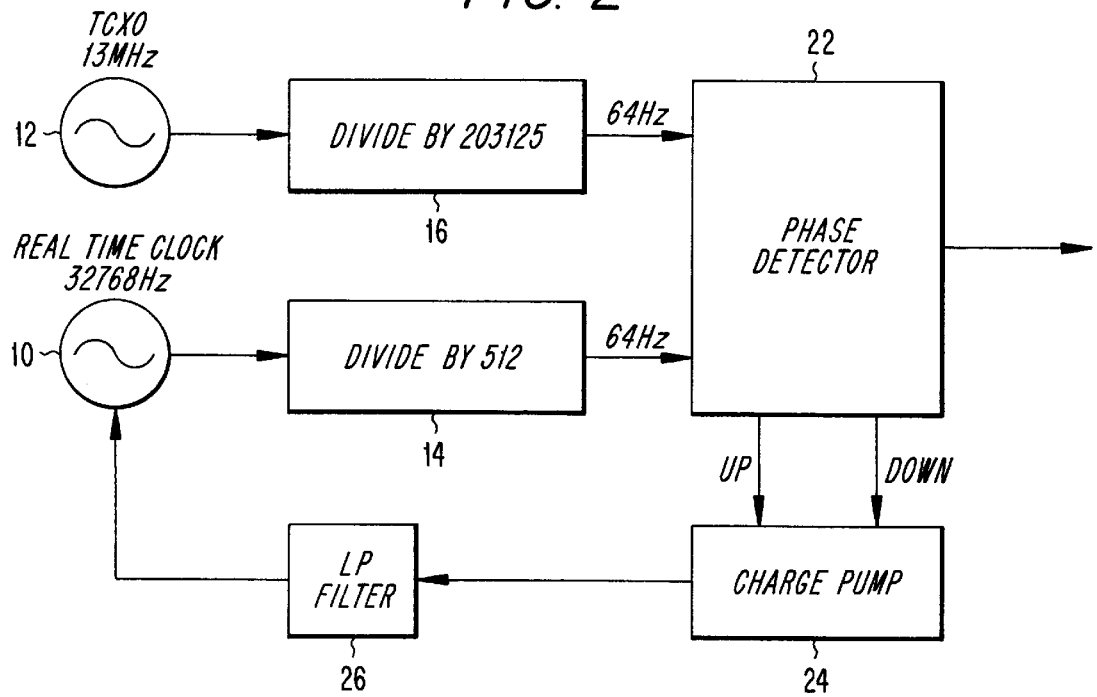
FIG. 2 is a block diagram of a power reduction circuit using a phase-locked loop timing correction circuit according to another embodiment of the present invention.

An exemplary implementation of this embodiment is shown in FIG. 2. The circuit of FIG. 2 includes a phase detector 22 which provides a digital output to a charge pump 24. The charge pump 24 provides a high impedance output of charge pulses up or down to the loop filter 26. The accuracy of the charge pulses is not important in this implementation since there are no strict requirements on noise or lock-in time. The output of charge pump 24 is filtered in a low-pass filter 26 and fed back to RTC 10 to control the frequency of the lower power clock.

As mentioned above, there is one restriction which limits the PLL lock-in time, which is that the comparison frequency must be sufficiently large. The comparison frequency $f_{comparison}$ can be defined as:

$$f_{comparison} = \frac{f_{VCXO}}{N} = \frac{f_{RTC}}{M}$$

where N and M are integers.

The RTC frequency is normally 32.768 kHz and in GSM the VCXO frequency is typically 13 MHz. This results in a maximum comparison frequency of 64 Hz. Typically the loop bandwidth of the PLL has to be 10 times lower, which means a loop bandwidth of 6 Hz and a lock-in time of roughly half a second. This is not sufficient if, as in GSM, it is desired to have a lock-in time <20 ms and to power down the VCXO for 2 seconds to reduce power consumption.

To achieve a higher comparison frequency (in the order of kHz), it is desirable to alter the RTC frequency, particularly where the VCXO frequency is predetermined, as in the GSM system. An RTC frequency of, for example, 40625 Hz will allow a PLL to be easily implemented. The disadvantage of such an implementation is that the crystal for this frequency is not a "standard" crystal and is therefore more expensive than the standard 32768 Hz crystal.

According to still another embodiment, a higher comparison frequency can be achieved by using a fractional-N PLL. The fractional-N PLL works by changing the counter values for one of the frequencies between N and N+1, thereby creating a new frequency which is a fraction of the other original frequency.

As an example, assume that the RTC is 32768 Hz and the VCXO is 13 MHz. The comparison frequency is preferably more than 2 kHz. 2048 Hz is chosen as a comparison since this is 32768/16 and easy to accomplish. Then the division ratio for the VCXO is $$N = \frac{13 \text{ MHz}}{2048} = 6347, 65625 = 6347 + \frac{21}{32}$$

This means that to lock the PLL, division ration N (6347) is used for 11 periods and then division ration N+1 (6348) is used for 21 periods. Thus there is another longer period to fully lock the fractional-N PLL. This period is 2048 Hz/32 =64 Hz, which is the same period as before. It will be appreciated that a 64 Hz modulation of the RTC can be avoided in alternative embodiments.

The simplest solution is to provide a relatively low loop bandwidth (e.g., 6 Hz), so that the RTC cannot follow the 64 Hz modulation. This will, however, eliminate the speed advantage over the higher comparison frequency in the fractional-N PLL.

Another solution is to feed a compensation current into the loop that compensates the error from the phase detector. Such a solution can be implemented by providing additional analog charge pump circuitry matched to the phase detector charge pump.

Figure 3:
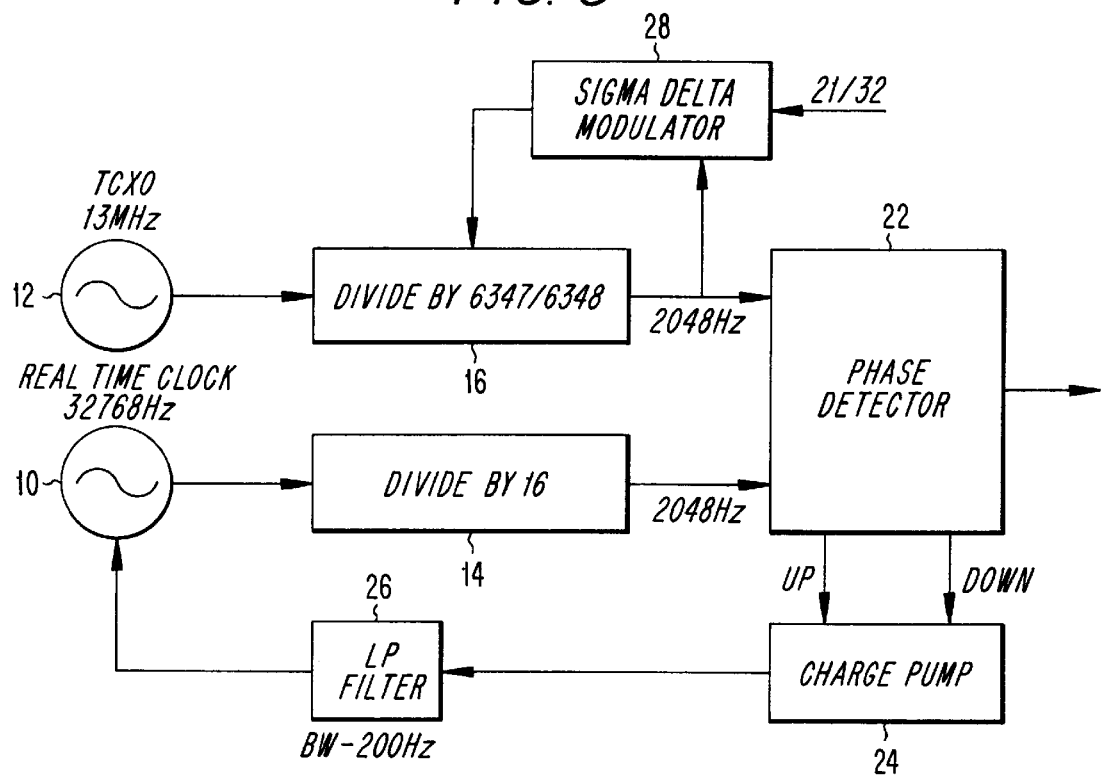
FIG. 3 is a block diagram of a power reduction circuit using a sigma-delta modulator according to an alternative embodiment of the present invention.

Another solution is shown in FIG. 3, and includes a digital sigma delta modulator 28 to digitally control the division ratio of the counter to generate the 21/32 ratio. This does not require any additional analog circuitry and increases the modulation noise frequency.

Figure 4:
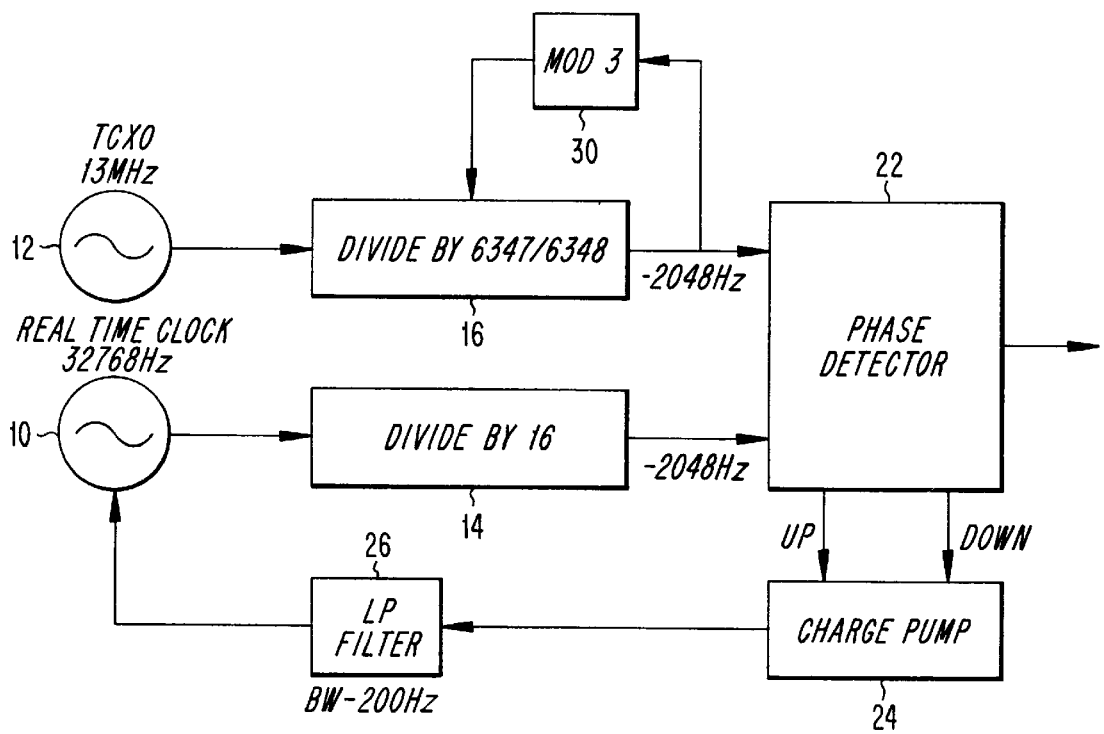
FIG. 4 is a block diagram of a power reduction circuit using a fractional-N phase-locked loop timing correction circuit according to yet another embodiment of the present invention.

An additional solution is shown in FIG. 4, which includes a modulo-e modulator 30, and which generates a frequency which is close to, but not equal to, the correct RTC frequency. By way of example:

$$N = \frac{13 \text{ MHz}}{2048} = 6347 + \frac{21}{32} = 6347 + \frac{2}{3}$$

$$f_{RTC} = \frac{34 \text{ MHz}}{6347 + \frac{2}{3}} \times 16 = 32767, 946 \text{ Hz}$$

Thus, the RTC frequency will not be exactly 32768 Hz but slightly lower (1.6 ppm lower). This small difference is not noticeable for the real time clock 10 and is so small that the system synchronization can be maintained without difficulty. This implementation achieves a significant advantage, since the fractional-N period is 2048/3=683 Hz, and is outside the loop bandwidth. The embodiment of FIG. 4 provides a very simple PLL with a fast lock-in time (<20 ms). All fractional-N period modulation can be performed outside the loop, and no normal fractional-N compensation is needed inside the loop.

The present invention makes it possible to power down the relatively accurate but power consuming VCXO when it is not needed and still maintain system synchronization using a low power, low frequency clock, with a synchronization means for increasing the accuracy of the low power clock.

While the foregoing description has included many details and specifications, it is to be understood that these are merely illustrative and are not to be construed as limitations of the invention. Numerous modifications to the disclosed examples will be readily apparent to those of ordinary skill in the art which do not depart from the spirit and scope of the invention, as defined by the following claims and their legal equivalents.

What is claimed is:

1. A method for reducing power consumption in a telecommunications device, comprising the steps of:

powering down a first system clock contained in the telecommunications device during a predetermined period of time; and powering up a second system clock contained in the telecommunications device during the predetermined period of time, the second system clock drawing less current than the first system clock, and the second system clock including synchronization means for substantially synchronizing the second system clock with the first system clock during the predetermined period of time, wherein the synchronization means includes first and second counters for counting the first and second system clocks, respectively, logic circuitry to substantially synchronize the second system clock with the first system clock, and a feedback loop connected between an output of the logic circuitry and an input to the second system clock.

2. The method of claim 1, wherein the feedback loop includes a digital to analog converter.

3. A method for reducing power consumption in a telecommunications device, comprising the steps of:

powering down a first system clock contained in the telecommunications device during a predetermined period of time; and powering up a second system clock contained in the telecommunications device during the predetermined period of time, the second system clock drawing less current than the first system clock, and the second system clock including synchronization means for substantially synchronizing the second system clock with the first system clock during the predetermined period of time, wherein the synchronization means includes first and second counters for counting the first and second system clocks, respectively, a phase detector for detecting a phase difference between outputs of the first and second counters, a charge pump for converting the phase difference to charge pulses and supplying the charge pulses to the second system clock, and wherein the synchronization means further includes a modulator connected between an output of the first counter and an input of the first counter, the modulator digitally controlling a division ratio of the first counter.

4. The method of claim 3, wherein the modulator is a sigma delta modulator which receives control information from an external source.

5. The method of claim 3, wherein the modulator receives no external control information.

6. A synchronization circuit in a telecommunications device, comprising:

a first system clock which operates at a first power level; and a second system clock which operates at a second power level lower than the first power level, the second system clock including synchronization means for substantially synchronizing the second system clock to the first system clock during a predetermined period of time in which the first system clock is powered down, wherein the synchronization means includes first and second counters for counting the first and second system clocks, respectively, and logic circuitry to substantially synchronize the second system clock with the first system clock, and a feedback loop connected between an output of the logic circuitry and an input to the second system clock.

7. The circuit of claim 6, wherein the feedback loop includes a digital to analog converter.

8. A synchronization circuit in a telecommunications device, comprising:

a first system clock which operates at a first power level; and a second system clock which operate at a second power level lower than the first power level, the second system clock including synchronization means for substantially synchronizing the second system clock to the first system clock during a predetermined period of time in which the first system clock is powered down, wherein the synchronization means includes first and second counters for counting the first and second system clock, respectively, a phase detector for detecting a phase difference between outputs of the first and second counters, a charge pump for converting the phase difference to charge pulses and supplying the charge pulses to the second system clock, and wherein the synchronization means further includes a modulator connected between an output of the first counter and an input of the first counter, the modulator digitally controlling a division ratio of the first counter.

9. The circuit of claim 8, wherein the modulator is a sigma delta modulator which receives control information from an external source.

10. The circuit of claim 8, wherein the modulator receives no external control information.

* * * * *